United States Patent [19]

Devecchi et al.

[11] Patent Number: 4,714,845
[45] Date of Patent: Dec. 22, 1987

[54] LOW OFFSET VOLTAGE FOLLOWER CIRCUIT

[75] Inventors: Daniele Devecchi, Desio; Guido Torelli, Alessio, both of Italy

[73] Assignee: SGS Microelettronica SpA, Agrate Brianza, Italy

[21] Appl. No.: 936,112

[22] Filed: Nov. 28, 1986

[30] Foreign Application Priority Data

Nov. 27, 1985 [IT] Italy .................. 23010 A/85

[51] Int. Cl.$^4$ ................ H03K 17/687; H03K 19/003; H03K 3/353; H03G 1/04
[52] U.S. Cl. ..................... 307/496; 307/497; 307/494; 307/359; 307/362; 307/262; 307/576; 330/253; 330/260
[58] Field of Search ............... 307/490, 491, 494, 496, 307/497, 500, 501, 362, 363, 359, 355, 585, 576, 579, 451, 264, 262; 330/264, 265, 253, 260

[56] References Cited

U.S. PATENT DOCUMENTS

| | | | |
|---|---|---|---|
| 3,702,943 | 11/1972 | Heuner et al. | 307/576 X |
| 4,477,737 | 10/1984 | Ulmer et al. | 307/491 X |
| 4,598,215 | 7/1986 | Schechtman et al. | 307/362 X |
| 4,634,894 | 1/1987 | Shu et al. | 307/496 X |
| 4,636,665 | 1/1987 | McLaughlin | 307/491 X |
| 4,649,292 | 3/1987 | Rusznyak | 307/362 |
| 4,658,157 | 4/1987 | McGowan | 307/496 X |

Primary Examiner—Stanley D. Miller
Assistant Examiner—David R. Bertelson
Attorney, Agent, or Firm—Wenderoth, Lind and Ponack

[57] ABSTRACT

A low offset voltage follower circuit includes substantially identical first and second N-channel MOS transistors having their source electrodes connected to a negative terminal of a supply voltage source via a third N-channel MOS transistor whose gate electrode is connected to a first reference voltage, and having their drain electrodes respectively connected to a positive terminal of the supply voltage source via fourth and fifth P-channel MOS transistors whose gate electrodes are connected to a second reference voltage. The gate electrode of the first transistor forms an input terminal of the follower circuit and the gate and drain electrodes of the second transistor are connected together to form an output terminal of the follower circuit. The follower circuit further includes a sixth P-channel MOS transistor having its source, gate and drain electrodes respectively connected to the drain electrodes of the first transistor and the source electrodes of the first and second transistors and the negative terminal of the supply voltage source.

8 Claims, 2 Drawing Figures

LOW OFFSET VOLTAGE FOLLOWER CIRCUIT

BACKGROUND OF THE INVENTION

The present invention relates to a voltage follower circuit, more particularly, to a low offset voltage follower circuit which is suitable for incorporation into a monolithically integrated circuit constructed using MOS (Metal Oxide Semiconductor) technology.

In an integrated circuit it is often necessary to apply a voltage supplied from a voltage source having a high output impedance to a load with a comparatively low impedance of a purely or predominantly capacitive type.

To satisfy this requirement, a voltage follower circuit is generally interposed between the voltage source and the load; the circuit output follows the input voltage and has a high input impedance and low output impedance thus producing an impedance decoupling between the voltage source and the load.

Voltage follower circuits are used, for example, in complex amplifiers in monolithically integrated circuits.

The essential requirements which a voltage follower circuit of this type must satisfy are:
a voltage gain substantially equal to unity;
a substantially zero offset voltage (i.e.-the difference between the DC output voltage and the DC input voltage);
maximum reduction of the harmonic distortion introduced into the output signal.
Other important requirements are:
low integration area occupation;
ease of insertion within more complex circuit structures;
low power dissipation with an adequate speed of response;
absence of both positive and negative voltage overshoots in the response to an input voltage signal having a stepped wave shape.

Known emitter follower and source follower circuits whose output follows the signal voltage supplied as an input thereto with a gain fairly close to unity may be used as voltage follower circuits. These known circuits, however, have an offset between the output voltage and the input voltage which is, in absolute terms, respectively equal to a base-emitter voltage (VBE) of a bipolar transistor or approximately equal to a threshold voltage (VTH) of a field effect transistor as is known to persons skilled in the art.

A further known voltage follower circuit, as shown in FIG. 1, comprises an amplifier A1 with a high open loop voltage gain A, which has an output terminal and a first inverting input terminal and a second non-inverting input terminal. The non-inverting input terminal forms an input terminal IN of the voltage follower circuit. The output terminal of the amplifier A1 is connected to the inverting input terminal via a conductor 101 for producing a "unity reaction feedback" and forms an output terminal OUT of the voltage follower circuit. A voltage to be followed VIN is supplied between the input terminal IN and a reference terminal, shown by VR in FIG. 1. The output voltage VOUT is then supplied by the follower circuit between the output terminal OUT and the reference terminal VR. The latter may possibly be the negative terminal VSS of a supply voltage source or a ground terminal.

A load, not shown in FIG. 1, may be inserted between the output terminal OUT and the terminal VR.

If the value of the gain A is sufficiently high, the output voltage VOUT follows the input voltage VIN as an excellent approximation thereof (the voltage gain of the voltage follower circuit is in fact $A/(1+A)$ and the circuit configuration shown adequately satisfies the first three requirements discussed above.

In order to achieve a gain close to unity for the signal voltage, it would be possible to use an operational amplifier with two voltage gain stages, whose open loop voltage gain A is relatively high.

As known to persons skilled in the art, the use of an operational amplifier of this type produces a system in which there may easily be a risk of instability and in which the possibility of overshoot, in some cases considerable, may not be excluded in the response to a voltage signal having a stepped wave shape supplied to the input terminal IN.

This type of amplifier therefore requires a compensation capacitor to ensure the stability of the circuit and to reduce the voltage overshoot in the circuit response to an input voltage signal having a stepped wave shape to a tolerable value. This leads to a considerable increase in integration area occupation which increases with increases in the capacitive value of the load which the voltage follower circuit has to drive.

The power dissipation of this circuit structure may also be excessive, given that in a two-stage operational amplifier there are various circuit "branches" which absorb supply current. It should be borne in mind in this respect that the presence of the compensation capacitor must also be taken into account in dimensioning the biasing currents of the two stages of the amplifier in order to obtain a suitable speed of response.

This circuit is not particularly suitable for insertion in more complex monolithically integrated circuit structures.

For these reasons, use is predominantly made of single stage amplifiers, even though the resultant follower circuit has some drawbacks.

A typical particularly simple embodiment of a single stage amplifier with MOS type field effect transistors used in voltage follower circuits will now be examined. The amplifier in this case comprises identical first and second MOS transistors having the same type of conductivity (for example N-channel transistors), whose respective source electrodes are connected together in a circuit node thereby forming a circuit structure commonly defined as a "coupled source differential pair" (see, for example, "Basic MOS Operational Amplifier Design—An Overview" by P. R. Gray in "Analog MOS Integrated Circuits", edited by P. R. Gray, D. A. Hodges and R. W. Brodersen, IEEE Press, New York, 1980, pp. 31–32).

This circuit node is connected to a negative terminal of a supply voltage source via a constant current generator, while the drain electrodes of the first and second transistors are respectively connected to a positive terminal of this supply voltage source via first and second substantially identical load components.

The gate electrodes of these first and second transistors respectively form a non-inverting input terminal and an inverting input terminal of the amplifier, whose output terminal is then formed by the drain electrode of the second transistor.

The two transistors operate in the saturation range.

The open loop voltage gain A of this amplifier is:

$$A = g_m Z_{OUT}/2 \tag{1}$$

in which $g_m$ is the transconductance of the two transistors (which obviously have the same transconductance) and $Z_{OUT}$ is the overall impedance present between the output terminal and the negative terminal of the supply voltage source.

The complexity of this circuit structure is due to the circuit technology used for the construction of the load components. These load components are generally constructed either with two identical resistors (possibly using MOS type transistors) or with two identical constant current generators with a high output impedance or by a current mirror circuit comprising two identical P-channel transistors if the circuit is constructed using complementary MOS type transistors.

In the first case, however, the open loop voltage gain of the amplifier cannot in practice be very high as a result of which the voltage gain of the follower circuit diverges substantially from unity. For the same reason, the offset between the output voltage and the input voltage may be non-negligible.

In the second case, there are serious problems in biasing of the transistors inserted in the circuit which may lead to a malfunction of the circuit itself (the first transistor of the differential pair may in particular be caused to operate outside of the saturation range) and which lead to the appearance of a systematic offset between the output voltage and the input voltage of the follower circuit for input voltage values outside of a very limited specific range.

In the third case, the overall structure of the voltage follower circuit comprising this current mirror amplifier does not enable, except for input voltage values in a very limited specific range, the achievement of identical biasing conditions for the two transistors of the differential pair. As a result of which, a systematic offset is provided between the output voltage and the input voltage. In addition, the presence within the follower circuit of a full feedback loop formed by the two transistors of the differential pair and the current mirror circuit structure leads, in the same way as mentioned above with respect to the circuit which uses an amplifier with two voltage gain stages, to possible instabilities and overshoot in the response to input voltage signals having a stepped wave shape.

SUMMARY OF THE INVENTION

The object of the present invention is to provide a low offset voltage follower circuit which improves overall on the operating characteristics of known circuits at the same cost.

The object is achieved in accordance with the present invention by providing a low offset voltage follower circuit having a substantially unity voltage gain comprising at least one input terminal for connection to a voltage generator and at least one output terminal for connection to a load, and using complementary MOS type transistors, said follower circuit comprising first, second and third transistors having a first type of conductivity, and fourth, fifth and sixth transistors having a second type of conductivity which is opposite to said first type of conductivity, said first and second transistors having source electrodes connected to a drain electrode of said third transistor, said third transistor having source and gate electrodes which are respectively connected to a first terminal of a supply voltage source and to a first voltage reference means for keeping said gate electrode at a constant potential with respect to said first terminal of said supply voltage source, a gate electrode of the first transistor forming said input terminal of said follower circuit, said fourth and fifth transistors having source electrodes connected to a second terminal of said supply voltage source, said fourth and fifth transistors having gate electrodes connected to a second voltage reference means for keeping said gate electrodes at a constant potential with respect to said second terminal of said supply voltage source, said fourth transistor having a drain electrode connected to a drain electrode of said first transistor and to a source electrode of said sixth transistor, said sixth transistor having drain and gate electrodes which are respectively connected to said first terminal of said supply voltage source and to source electrodes of said first and second transistors, said second transistor having drain and gate electrodes which are connected to a drain electrode of said fifth transistor at a circuit node which forms said output terminal of said follower circuit.

BRIEF DESCRIPTION OF THE DRAWINGS

The following detailed description of the present invention is given purely by way of non-limiting example with reference to the attached drawings, in which.

DESCRIPTION OF THE PREFERRED EMBODIMENT

Figure 2:
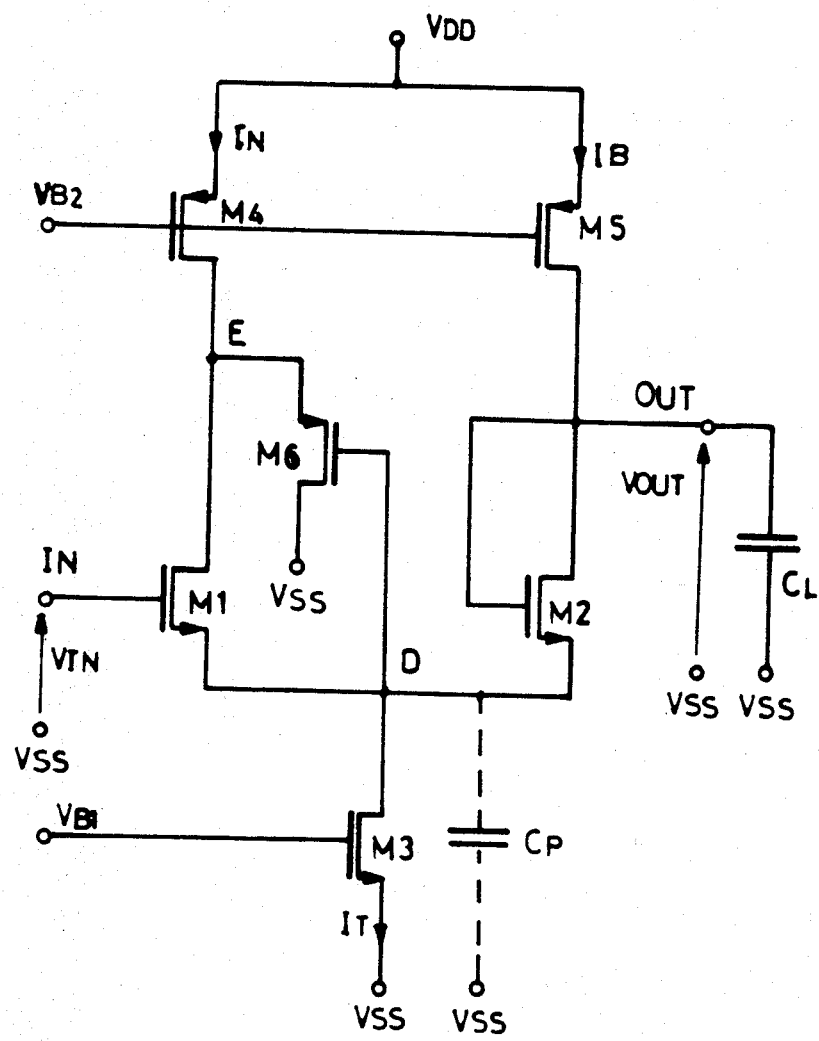
FIG. 2 is a circuit diagram of a low offset voltage follower circuit of the present invention.

The diagram shown in FIG. 2 relates to a circuit constructed in integrated form using complementary MOS type transistors.

The circuit comprises first, second and third N-channel transistors M1, M2 and M3 and fourth, fifth and sixth P-channel transistors M4, M5 and M6. The source electrodes of the transistors M1 and M2 and the drain electrode of the transistor M3 are connected together in a first circuit node D.

The source and gate electrodes of the transistor M3 are respectively connected to a negative terminal VSS of a supply voltage source and to a first voltage reference VB1 formed by a circuit means (not shown in FIG.

2) which keep this gate electrode at a constant potential with respect to the negative terminal VSS.

The gate electrode of the transistor M1 forms an input terminal IN of the voltage follower circuit.

The source electrodes of the transistors M4 and M5 are connected to a positive terminal VDD of the supply voltage source.

The gate electrodes of the transistors M4 and M5 are connected to a second voltage reference VB2 formed by a circuit means (not shown in FIG. 2) which keep these gate electrodes at a constant potential with respect to the positive terminal VDD.

The drain electrodes of the transistors M4 and M1 and the source electrode of the transistor M6 are connected together in a second circuit node E.

The drain and gate electrodes of the transistor M6 are respectively connected to the negative terminal VSS and the circuit node D.

The drain and gate electrodes of the transistor M2 are connected to the drain electrode of the transistor M5 to form a third circuit node which forms an output terminal OUT of the voltage follower circuit. A load CL of capacitive type, for example, is connected between the output terminal OUT and the negative terminal VSS.

The transistors M1 and M2 preferably have, in accordance with the present invention, identical physical and electrical characteristics. Their substrate electrodes, not shown in FIG. 2, are connected together and are connected either to the source electrodes of the two transistors themselves or to the negative terminal VSS.

All of the transistors operate in the saturation range.

An input voltage VIN is supplied between the input terminal IN and the negative terminal VSS. The resultant voltage between the output terminal OUT and the negative terminal VSS is the output voltage VOUT of the voltage follower circuit.

FIG. 2 also shows by a dashed line a stray capacitance CP which exists in general between the node D and the negative terminal VSS in a monolithically integrated device of the present invention.

During operation, the two transistors M4 and M5 have a constant current passing through them since a fixed voltage is supplied between the respective gate and source electrodes. The ratio between the width W and the length L ("W/L factor") of the transistor M4 is dimensioned such that it is n times that of the transistor M5, with n being greater than 1, as a result of which a current IN equivalent to n times the current IB passing through M5 passes through the transistor M4. Using conventional design techniques for reference voltage generators, as is known to persons skilled in the art, the reference voltages VB1 and VB2 are provided with values such that the current IT passing through the transistor M3 is double the current IB passing through the transistor M5.

In rest conditions, the current passing through the transistor M2 is obviously equal to the current IB which passes through the transistor M5. The current passing through the transistor M1 is equal to the difference between the current passing through the transistor M3 (equal to 2 IB) and the current passing through the transistor M2 and is therefore equal to IB. As a result of which, the transistors M1 and M2 have exactly the same current IB passing through them. The transistor M6 therefore has the current (n−1)IB passing through it.

The transistors M4 and M6 are dimensioned such that, in rest conditions, the voltage between the drain and source electrodes of the transistor M1 is equal to the voltage between the drain and source electrodes of the transistor M2.

The relationship between the resultant signal voltage VD between the node D and the negative terminal VSS and the signal voltage VIN supplied between the input terminal IN and the VSS negative terminal may be expressed as:

$$VD = VIN \cdot g_{m1} Z_D / 1 + g_{m1} Z_D \qquad (2)$$

in which $g_{m1}$ is the transconductance of the transistor M1 and $Z_D$ is the overall impedance existing between the node D and the negative terminal VSS. Equation (2) is strictly valid only in the case in which the substrate electrode of the transistor M1 is connected to the node D. It may, however, be considered valid for practical purposes as a suitable approximation in the case in which the substrate electrode of the transistor M1 is connected to the negative terminal VSS.

Assuming $g_{m1} \gg 1/Z_D$, as may be readily achieved with transistors having conventional geometrical dimensions, for operating frequencies below the cut off frequency ft of the circuit, VD≃VIN is obtained, as a result of which the voltage gain G1 between the input terminal IN and the node D is substantially unity.

The voltage-current law for the transistor M1, as is known to persons skilled in the art, is roughly:

$$I = k'_1 (W/L)_1 (VIN - VD - VT_1)^2 [1 + \lambda_1 \cdot (VE - VD - VDS_{sat1})] \qquad (3)$$

in which $k'_1$ is the conduction factor of the transistor M1, $(W/L)_1$ is its W/L factor, $VT_1$ is its threshold voltage, $VDS_{sat1}$ is its so-called "drain-source" saturation voltage (i.e. the minimum value of the voltage between drain and source required for the transistors to operate in the saturation range for a predetermined value of the voltage between gate and source) and $\lambda_1$ is its current modulation coefficient due to the variation of the actual length of the channel with variations in the voltage supplied between the drain and source electrodes of the transistor itself. In equation (3), VIN is the overal voltage supplied between the input terminal IN and the negative terminal VSS and VD and VE are the overall resultant voltages between the respective nodes D and E and the negative terminal VSS.

Between the source electrode and the gate electrode of the transistor M1 there is therefore a rest voltage $V_{off_1}$ equal to:

$$V_{off_1} = VD - VIN = -VT_1 - \sqrt{\frac{IB}{k'_1(W/L)_1} \cdot \frac{1}{1 + \lambda_1(VE - VD - VDS_{sat1})}} \qquad (4)$$

This voltage represents the offset voltage between the node D and the input terminal of the circuit IN.

Looking now at the transistor M2, the relationship between the signal voltage VD between the node D and the negative terminal VSS and the signal voltage VOUT between the output terminal OUT and the negative terminal VSS, may be expressed as:

$$VOUT = VD \cdot \frac{ZOUT(1 + g_{m2}Z_2)}{ZOUT + Z_2 + Z_2 ZOUT g_{m2}} \quad (5)$$

in which $Z_2$ and $g_{m2}$ are respectively the output impedance and the transconductance of the transistor M2 in common source configuration and ZOUT is the total impedance of the load present between the terminal OUT and the negative terminal VSS, comprising the output impedance of the transistor M5. Equation (5) is strictly valid in the case in which the substrate electrode of the transistor M2 is connected to the node D.

Assuming $g_{m2} \gg 1/Z_2$ for the transistor M2, in a similar way to the transistor M1, and also assuming $g_{m2} \gg 1/ZOUT$, $VOUT \simeq VD$ is obtained, as a result of which the voltage gain G2 between the node D and the output terminal of the circuit OUT is substantially unity.

The voltage-current law for the transistor M2 is roughly:

$$I = k'_2(W/L)_2(VOUT - VD - VT_2)^2[1 + \lambda_2 \cdot (VOUT - VD - VDS_{sat2})] \quad (6)$$

in which the symbols used in equation (3) for the values relating to the transistor M1 are used for the transistor M2, but the subscripts are changed.

Between the OUT terminal and the node D there is therefore a rest voltage $Voff_2$ equal to:

$$Voff_2 = VOUT - VD = +VT_2 + \quad (7)$$

$$\sqrt{\frac{IB}{k'_2(W/L)_2} \cdot \frac{1}{1 + \lambda_2(VOUT - VD - VDS_{sat2})}}$$

This voltage represents the offset voltage between the node D and the output terminal of the circuit OUT.

The complete identity of biasing conditions and physical and electrical characteristics of the transistors M1 and M2 means that $Voff_2 = -Voff_1$.

The circuit of FIG. 2 therefore has a substantially unity voltage gain (this gain GT is in effect equal to the product of G1·G2) and a substantially zero offset voltage between output and input (the total offset voltage Voff is in effect equal to the sum of the voltages $Voff_1$ and $Voff_2$).

As regards the signal voltage, the cut off frequency of the structure, assuming that the load capacitance CL is much greater than the stray capacitance CP of the node D is, as is normally the case, $ft \simeq g_{m1}/4\pi CL$, taking into account the fact that the transconductance of the transistor M2 is identical to that of the transistor M1 and consequently that the overall output impedance of the voltage follower circuit is substantially $2/g_{m1}$.

For frequencies lower than the cut off frequency, the current passing through the transistor M2 is substantially equal to the current passing through the transistor M1. The connections of the transistor M6 are such that the signal voltage between the node E and the negative terminal VSS follows the signal voltage VD between the node D and the negative terminal VSS which, in turn, as mentioned above, follows the signal voltage VIN supplied between the input terminal IN and the negative terminal VSS.

Consequently, even as regards the behavior of the circuit when a signal voltage is supplied between its input terminal and the negative terminal VSS, the two transistors M1 and M2 always operate under exactly the same conditions which ensures that the circuit behaves in an excellent way.

It should be noted that the voltage gain of the circuit shown in FIG. 2 is independent from the point of operation and therefore from the value of the input and output voltages over the entire range of admissible input voltage values (dynamic input range).

This characteristic of a circuit of the present invention means that even in the presence of broad input signals, the harmonic distortion introduced into the output signal in minimized.

The integration area occupation required by a voltage follower circuit of the present invention is minimal since it substantially comprises two circuit branches only and does not require large compensation capacitors.

The power dissipation of the circuit, which depends in practice on the required speed of response and the load present in the application in which the circuit is used, is limited since the circuit is formed by two circuit branches alone.

Figure 1:
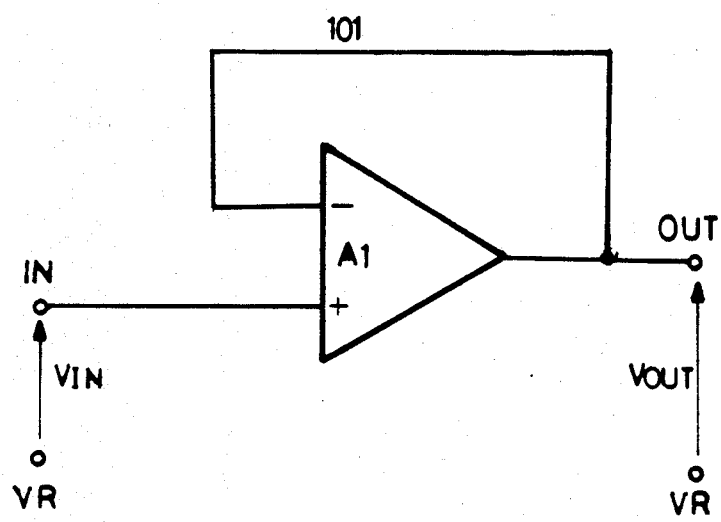
FIG. 1 is a diagram of a known voltage follower circuit comprising an amplifier subject to degeneration as described above.

It should be noted, finally, that the circuit shown in FIG. 2 contains no amplifier subject to degeneration of the type shown in the diagram of FIG. 1. The absence in this circuit of a feedback loop between output and input containing a component with a high open loop voltage gain prevents any instability in the system and the possibility of overshoot in the response to a voltage signal supplied to the input and having a stepped wave shape.

In a circuit of the present invention a variation, even if this is substantial, of biasing currents IB, IT and IN enables a change in the value of the output impedance without introducing any problem of instability into the system or overshoot in the response to a voltage signal supplied to the input and having a stepped wave shape.

This enables easier control of the output impedance in the follower circuit. For example, it is possible to obtain a circuit in which the biasing currents, and therefore the output impedance value of the circuit may be controlled by programming of the values of the two voltage references VB1 and VB2.

In the same way, the speed of response of the system may also be controlled, depending of course on the value of the current IB passing through the output branch in rest conditions.

In the case in which the load which the circuit has to drive has a resistive component (possibly active), it is then possible to dimension the transistors and the biasing currents such that the biasing conditions of the transistors M1 and M2 are substantially identical and therefore that the requirements of a voltage follower circuit are fully satisfied, even if this may lead to a slight worsening of the power dissipation.

Although a single embodiment of the invention has been described and illustrated it is obvious that many variants are possible without departing from the scope of the invention.

For example, in a circuit of the invention the two transistors M1 and M2 may have the same length and different widths. Dimensioning of the other transistors of the circuit, in this case, must be such that the values of the currents passing, during rest conditions, through the transistors M1 and M2 are proportional to the widths of the two transistors. In this way the current densities passing through each of the two transistors are substantially equal, as a result of which all the comments made on the circuit described above are also valid for this circuit, and therefore this voltage follower circuit satisfies all the requirements set out in the preamble.

Another circuit of the invention may be constructed in a way which is fully complementary with the circuit shown in FIG. 2. The transistors M4 and M5, in this case, must be two N-channel transistors with their source electrodes connected to the negative terminal of the supply voltage source rather than to the positive terminal. The transistors M1 and M2 must be two P-channel transistors in the same way as the transistor M3 whose source electrode is connected to the positive terminal of the supply voltage source M6 must be an N-channel transistor and its drain electrode is connected to the positive terminal of the supply voltage source. The gate electrodes of the transistors M4 and M5 are connected to a voltage reference which keeps these electrodes at a constant potential with respect to the negative terminal of the supply voltage source. The gate electrode of the transistor M3 is connected to a voltage reference which keeps it at a constant potential with respect to the positive terminal of the supply voltage source.

It is also possible to obtain from FIG. 2, with simple circuit modifications, a circuit which makes use solely of MOS transistors with the same polarity (i.e. only N-channel or P-channel transistors).

We claim:

1. A low offset voltage follower circuit having a substantially unity voltage gain comprising at least one input terminal for connection to a voltage generator and at least one output terminal for connection to a load, and using complementary MOS type transistors, said voltage follower circuit comprising first, second and third transistors having a first type of conductivity, and fourth, fifth and sixth transistors having a second type of conductivity which is opposite to said first type of conductivity, said first and second transistors having source electrodes connected to a drain electrode of said third transistor, said third transistor having source and gate electrodes which are respectively connected to a first terminal of a supply voltage source and to a first voltage reference means for keeping said gate electrode at a constant potential with respect to said first terminal of said supply voltage source, a gate electrode of the first transistor forming said input terminal of said follower circuit, said fourth and fifth transistors having source electrodes connected to a second terminal of said supply voltage source, said fourth and fifth transistors having gate electrodes connected to a second voltage reference means for keeping said gate electrodes at a constant potential with respect to said second terminal of said supply voltage source, said fourth transistor having a drain electrode connected to a drain electrode of said first transistor and to a source electrode of said sixth transistor, said sixth transistor having drain and gate electrodes which are respectively connected to said first terminal of said supply voltage source and to source electrodes of said first and second transistors, said second transistor having drain and gate electrodes connected to a drain electrode of said fifth transistor at a circuit node which forms said output terminal of said follower circuit.

2. A voltage follower circuit as recited in claim 1, wherein said first and second transistors have substantially identical physical and electrical characteristics.

3. A voltage follower circuit as recited in claim 1, wherein said first and second transistors have substrate electrodes which are connected together.

4. A voltage follower circuit as recited in claim 1, wherein biasing conditions of the circuit for said first and second transistors are arranged so as to be substantially identical.

5. A voltage follower circuit as recited in claim 1 said first, second and third transistors are of the N-channel type, and said fourth, fifth and sixth transistors are of the P-channel type.

6. A voltage follower circuit as recited in claim 2 said first, second and third transistors are of the N-channel type, and said fourth, fifth and sixth transistors are of the P-channel type.

7. A voltage follower circuit as recited in claim 3 said first, second and third transistors are of the N-channel type, and said fourth, fifth and sixth transistors are of the P-channel type.

8. A voltage follower circuit as recited in claim 4 said first, second and third transistors are of the N-channel type, and said fourth, fifth and sixth transistors are of the P-channel type.

* * * * *